United States Patent
Lu et al.

(10) Patent No.: US 9,417,534 B2
(45) Date of Patent: *Aug. 16, 2016

(54) LITHOGRAPHY METHOD AND STRUCTURE FOR RESOLUTION ENHANCEMENT WITH A TWO-STATE MASK

(71) Applicant: Taiwan Semiconductor Manufacturing Company, Ltd., Hsin-Chu (TW)

(72) Inventors: Yen-Cheng Lu, New Taipei (TW); Shinn-Sheng Yu, Hsinchu (TW); Anthony Yen, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 1 day.

This patent is subject to a terminal disclaimer.

(21) Appl. No.: 14/298,589

(22) Filed: Jun. 6, 2014

(65) Prior Publication Data

US 2014/0285789 A1  Sep. 25, 2014
US 2016/0209757 A9  Jul. 21, 2016

Related U.S. Application Data

(63) Continuation-in-part of application No. 13/437,099, filed on Apr. 2, 2012, now Pat. No. 8,841,047, and a continuation-in-part of application No. 14/152,680, filed on Jan. 10, 2014, now Pat. No. 9,285,671, which is a continuation of application No. 13/542,458, filed on Jul. 5, 2012, now Pat. No. 8,628,897.

(51) Int. Cl.
*G03F 7/20* (2006.01)
*G03F 1/38* (2012.01)
(Continued)

(52) U.S. Cl.
CPC .............. *G03F 7/70191* (2013.01); *G03F 1/24* (2013.01); *G03F 1/38* (2013.01); *G03F 1/58* (2013.01); *G03F 7/20* (2013.01); *G03F 7/70091* (2013.01); *G03F 7/70941* (2013.01)

(58) Field of Classification Search
CPC ..... G03F 7/70191; G03F 7/70091; G03F 1/24; G03F 1/38; G03F 1/58; G03F 1/144
USPC .................................................. 430/5; 355/71
See application file for complete search history.

(56) References Cited

U.S. PATENT DOCUMENTS 4,947,413 A * 8/1990 Jewell et al. .................... 378/34
5,487,963 A * 1/1996 Sugawara ......................... 430/5
(Continued)

FOREIGN PATENT DOCUMENTS

TW   201405241   2/2014

OTHER PUBLICATIONS

Pei-Yang Yan et al., "EUVL Alternating Phase Shift Mask," Proc. of SPIE vol. 7969, 2011, pp. 79690G-1-G10.
(Continued)

*Primary Examiner* — Stewart Fraser
(74) *Attorney, Agent, or Firm* — Haynes and Boone, LLP

(57) ABSTRACT

A lithography process in a lithography system includes loading a mask that includes two mask states defining an integrated circuit (IC) pattern. The IC pattern includes a plurality of main polygons, wherein adjacent main polygons are assigned to different mask states; and a background includes a field in one of the mask states and a plurality of subresolution polygons in another of the two mask states. The lithography process further includes configuring an illuminator to generate an illuminating pattern on an illumination pupil plane of the lithography system; configuring a pupil filter on a projection pupil plane of the lithography system with a filtering pattern determined according to the illumination pattern; and performing an exposure process to a target with the illuminator, the mask, and the pupil filter. The exposure process produces diffracted light and non-diffracted light behind the mask and the pupil filter removes most of the non-diffracted light.

21 Claims, 15 Drawing Sheets

(51) Int. Cl.
*G03F 1/24* (2012.01)
*G03F 1/58* (2012.01)

(56) References Cited

U.S. PATENT DOCUMENTS

| | | |
|---|---|---|
| 6,986,971 B2 | 1/2006 | Han et al. |
| 7,695,877 B2 | 4/2010 | Leunissen et al. |
| 7,939,228 B2 | 5/2011 | Kim |
| 8,628,897 B1 | 1/2014 | Lu et al. |
| 8,691,476 B2 | 4/2014 | Yu et al. |
| 8,841,047 B2 | 9/2014 | Yu et al. |
| 2002/0177050 A1 | 11/2002 | Tanaka |
| 2004/0091789 A1 | 5/2004 | Han et al. |
| 2007/0154817 A1 | 7/2007 | Leunissen et al. |
| 2009/0220869 A1 | 9/2009 | Takai |
| 2009/0263730 A1 | 10/2009 | Kim |
| 2013/0017474 A1* | 1/2013 | Chiang et al. ............. 430/5 |
| 2013/0157177 A1 | 6/2013 | Yu et al. |
| 2013/0260288 A1 | 10/2013 | Yu et al. |
| 2014/0011120 A1 | 1/2014 | Lu et al. |
| 2014/0268087 A1* | 9/2014 | Yu et al. ............. 355/71 |
| 2015/0085268 A1 | 3/2015 | Lu et al. |
| 2015/0098069 A1 | 4/2015 | Lu et al. |

OTHER PUBLICATIONS

Andrew B. Kahng et al., "Automated Layout and Phase Assignment Techniques for Dark Field Alternating PSM," SPIE vol. 3546, Part of the BACUS Symposium on Photomask Technology and Management, Redwood City, California, Sep. 1998, pp. 222-231.
Martin Lowisch et al., "Optics for EUV Production," Proc. of SPIE vol. 7636, 2010, 11 pages.
Alfred Kwok-Kit Wong, "Resolution Enhancement Techniques in Optical Lithography," SPIE Digital Library, Published by The International Society for Optical Engineering, 2001, Chapter 7—Selecting Appropriate RETs, SPIE Press (2001), 18 pages.
Alfred Kwok-Kit Wong, "Resolution Enhancement Techniques in Optical Lithography," SPIE Digital Library, Published by The International Society for Optical Engineering, 2001, Chapter 8—Second-Generation RETS, SPIE Press (2001), 11 pages.
Alfred Kwok-Kit Wong, "Resolution Enhancement Techniques in Optical Lithography," SPIE Digital Library, Published by The International Society for Optical Engineering, 2001, Bibliography, SPIE Press (2001), 26 pages.
Alfred Kwok-Kit Wong, "Resolution Enhancement Techniques in Optical Lithography," SPIE Digital Library, Published by The International Society for Optical Engineering, 2001, Concluding Remarks, SPIE Press (2001), 3 pages.
Alfred Kwok-Kit Wong, "Resolution Enhancement Techniques in Optical Lithography," SPIE Digital Library, Published by The International Society for Optical Engineering, 2001, Conversion Charts, SPIE Press (2001), 2 pages.
U.S. Appl. No. 14/288,698, filed May 28, 2014, by inventors Shinn-Sheng Yu, Yen-Cheng Lu, and Anthony Yen for "Lithography and Mask for Resolution Enhancement," 21 pages of text, 16 pages of drawings.
U.S. Appl. No. 14/221,555, filed Mar. 21, 2014, by inventors Yen-Cheng Lu, Shinn-Sheng Yu, Jeng-Horng Chen, and Anthony Yen for "An Extreme Ultraviolet Lithography Process and Mask with Reduced Shadow Effect and Enhanced Intensity," 27 pages of text, 8 pages of drawings.
Taiwan Patent Office, Taiwan Office Action dated Jun. 8, 2016 for Application No. 104118357, 6 pages.

* cited by examiner

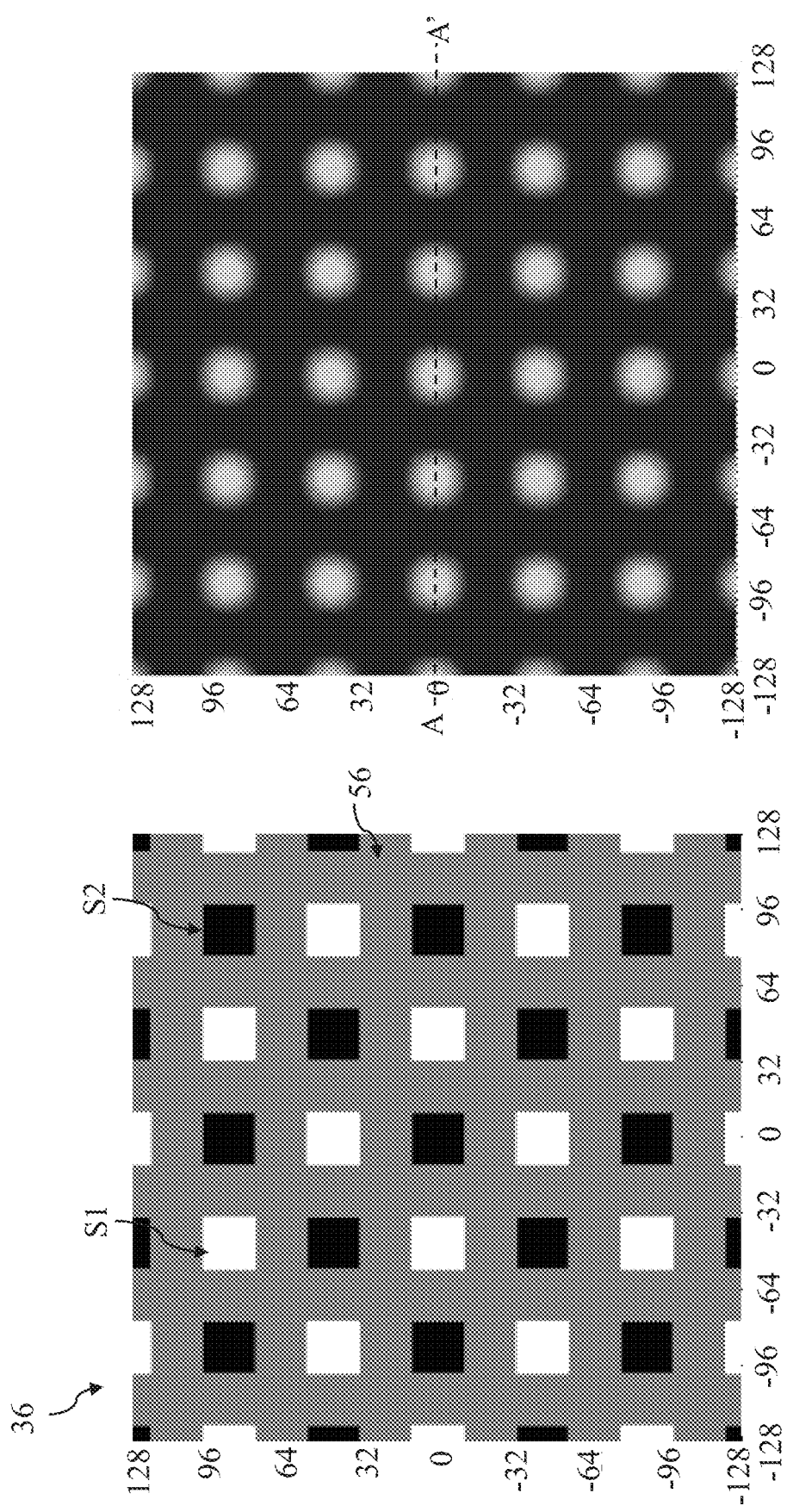

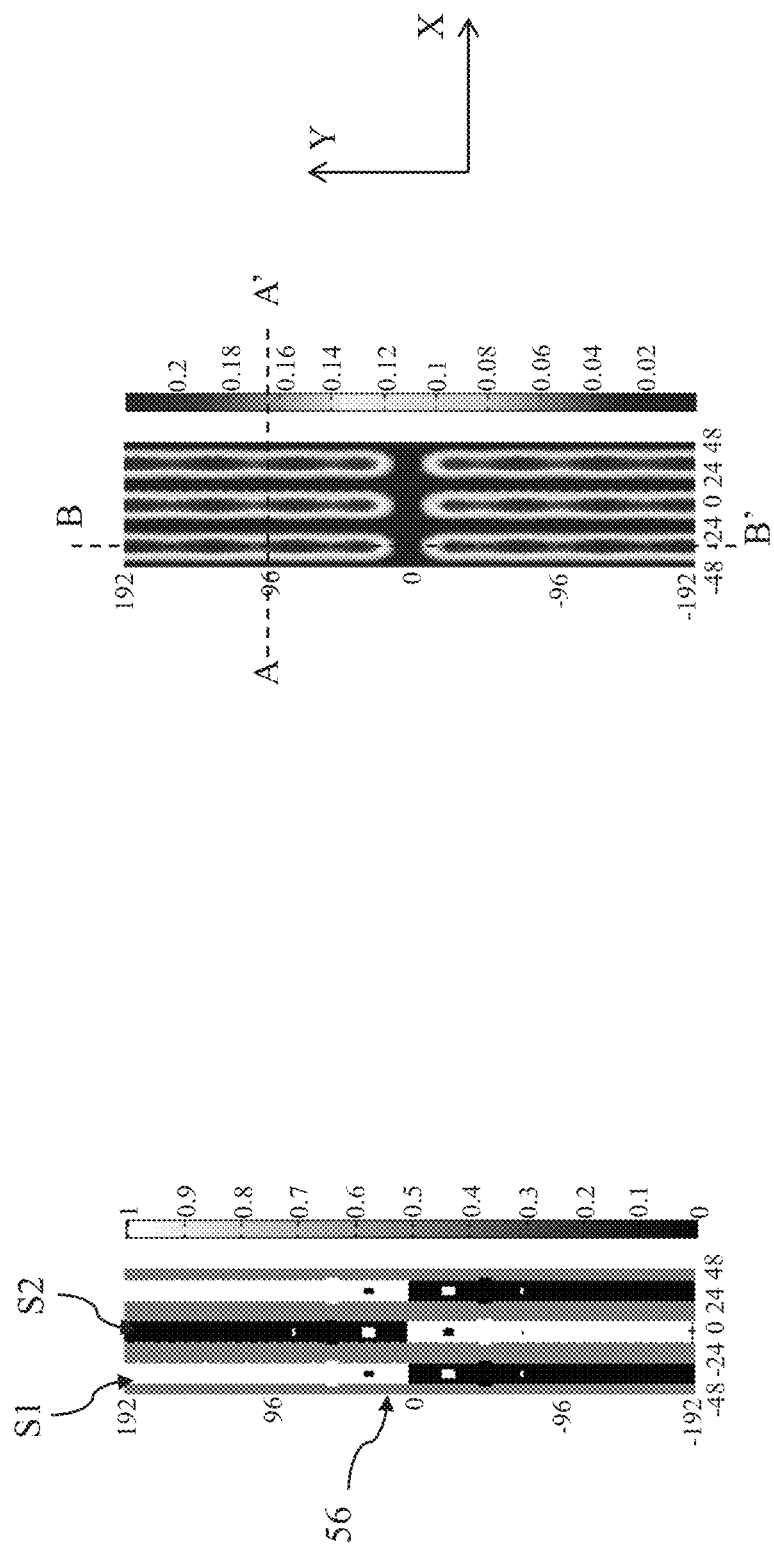

LITHOGRAPHY METHOD AND STRUCTURE FOR RESOLUTION ENHANCEMENT WITH A TWO-STATE MASK

This application is a continuation-in-part application of application Ser. No. 13/437,099 filed Apr. 2, 2012, entitled "Extreme Ultraviolet Lithography Process and Mask," now U.S. Pat. No. 8,841,047, the entire disclosure of which is incorporated herein by reference. This application is a continuation-in-part application of application Ser. No. 14/152,680, filed Jan. 10, 2014, which is a continuation application of application Ser. No. 13/542,458 filed Jul. 5, 2012, now U.S. Pat. No. 8,628,897, each of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. Various lithography techniques include phase shift mask and off-axis illumination. But existing technique has respective limitations needed to be overcome, such as shadowing effect.

Therefore, while existing lithography techniques have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10A is a top view of a mask constructed in accordance with some embodiments.

FIG. 10B is a diagrammatic view of the exposure energy distribution in gray scale associated with the mask of FIG. 10A.

FIG. 11A is a top view of a mask constructed in accordance with some embodiments.

FIG. 11B is a diagrammatic view of the exposure energy distribution in gray scale associated with the mask of FIG. 11A.

DETAILED DESCRIPTION

Figure 1:
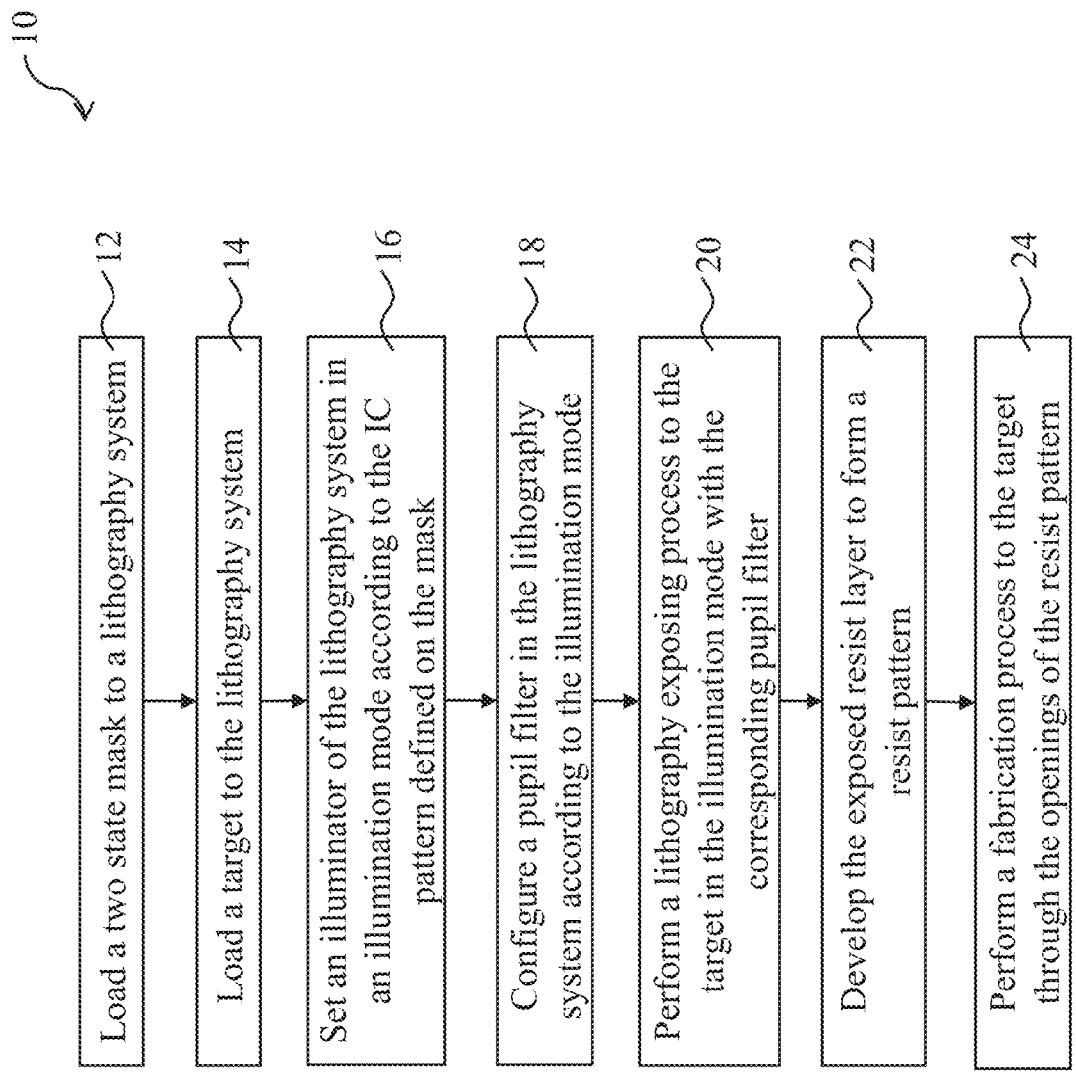
FIG. 1 is a flowchart of a lithography process constructed in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a flowchart of a method 10 to perform a lithography process in an integrated circuit fabrication constructed according to aspects of the present disclosure in various embodiments. The method 10, the lithography system and the mask implemented by the method 10 are described with reference to FIG. 1 and other figures.

Referring to FIG. 1, the method 10 includes an operation 12 by loading to a lithography system 30 with a photomask (mask or reticle) 36 having two mask states. In the present disclosure, the mask 36 is designed to have mask states with respective transmissivities different from each other. The lithography system 30 and the mask 36 are described below respectively.

Figure 2:
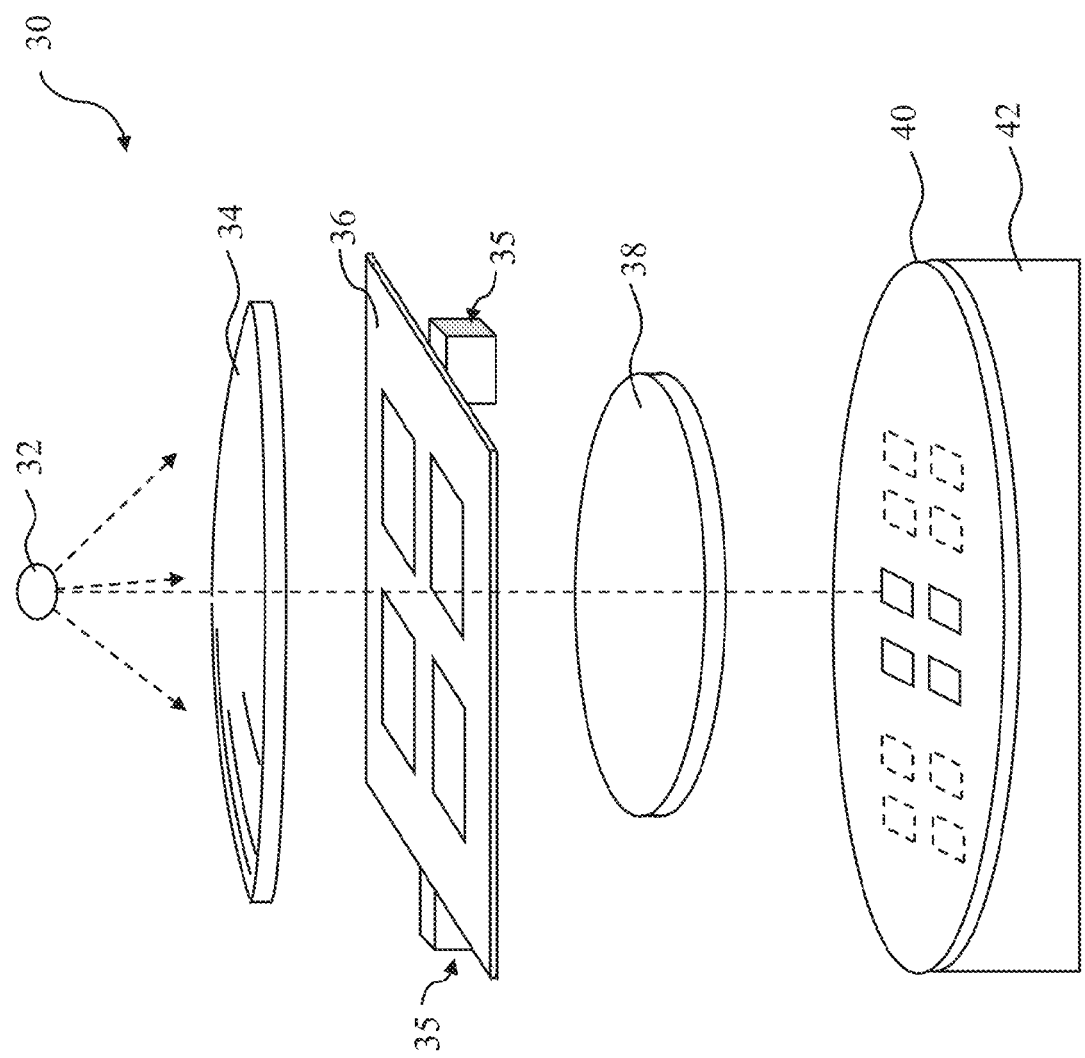
FIG. 2 is a block diagram of a lithography system for implementing the method of FIG. 1 and a mask structure constructed in accordance with some embodiments.

The lithography system 30 is illustrated in FIG. 2 in a schematic view, in accordance with some embodiments. The lithography system 30 is designed to perform a lithography exposure process to a radiation-sensitive material layer (e.g., photoresist layer or resist layer). The lithography system 30 is operated in a proper exposure mode. In some embodiments, an exposure mode is implemented such that the image of a mask is formed on an integrated circuit (IC) substrate by one shot. In some embodiments, a step-and-exposure mode is implemented such that the image of the mask is repeatedly formed on a plurality of field regions on the IC substrate. In some embodiments, a step-and-scan mode is implemented such that the image of the mask is repeatedly scanned to a plurality of field regions on the IC substrate.

The lithography system 30 employs a radiation source 32 to generate radiation energy, such as ultraviolet (UV) light. In various embodiments, the radiation source may include a UV source, or deep UV (DUV) source. For example, the radiation source 32 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; or other light sources having a desired wavelength.

In some other embodiments, the radiation source 32 includes a Fluoride ($F_2$) excimer laser with a wavelength of 157 nm or an extreme UV (EUV) source having a wavelength ranging between about 1 nm and about 100 nm. In one particular example, the EUV radiation source 32 generates a EUV light with a wavelength centered at about 13.5 nm.

The lithography system 30 also includes an optical subsystem that receives the radiation energy from the radiation source 32, modulates the radiation energy by the image of a mask and directs the radiation energy to a resist layer coated on the IC substrate. The optical subsystem includes an illuminator and a projection optics box (POB). In some embodiments, the optical subsystem is designed to have a refractive mechanism. In this situation, the optical subsystem includes various refractive components, such as lenses.

In some other embodiment where the radiation energy is from $F_2$ excimer laser or EUV radiation source, the optical subsystem is designed to have a reflective mechanism. In this situation, the optical subsystem includes various reflective components, such as mirrors.

Particularly, the lithography system 30 employs an illuminator (e.g., a condenser) 34. In some embodiments where the optical subsystem has a refractive mechanism, the illuminator 34 may include a single lens or a lens module having multiple lenses (zone plates) and/or other lens components. For example, the illuminator 34 may include microlens arrays, shadow masks, and/or other structures designed to aid in directing radiation energy from the radiation source 32 onto a mask (also referred to as mask or reticle) 36.

The illuminator 32 is operable to provide an on-axis illumination (ONI) to illuminate the mask 36, where the ONI is designed according to various aspects of the present disclosure, as further described later. In some embodiments, an illumination aperture is configured to provide the on-axis illumination. In some embodiments, the illuminator 34 includes a plurality of lenses that are tunable for reconfiguration so to redirect the radiation light to different illumination positions, thereby achieving the ONI. In some other embodiments, a stage prior to the illuminator 34 may additionally include other lens or other optical components that are controllable to direct the radiation light to different illumination positions, thereby achieving the ONI.

In some other embodiments where the optical subsystem has a reflective mechanism, the illuminator 34 may employ a single mirror or a mirror system having multiple mirrors in order to direct light from the radiation source onto the mask, thereby achieving the ONI. The illuminator is operable to configure the mirrors to provide ONI to the mask. In one example, the mirrors of the illuminator are switchable to reflect EUV light to different illumination positions. In another embodiment, a stage prior to the illuminator 34 additionally include other switchable mirrors that are controllable to direct the EUV light to different illumination positions with the mirrors of the illuminator. Accordingly, the lithography system is able to achieve an on-axis illumination without sacrificing the illumination energy.

The lithography system 30 also includes a mask stage 35 configured to secure the mask 36 by a suitable clamping mechanism, such as vacuum clamping or e-chuck. The mask stage 35 is designed and configured to be operable for translational and rotational motions according to some embodiments.

The mask 36 may be a transmissive mask or a reflective mask. In the present embodiment, the mask 36 is a transmissive mask such as one described in further detail later.

The lithography system 30 also employs a POB 38 for imaging the pattern of the mask 36 on to a target 40 (IC substrate such as a semiconductor wafer or simply a wafer) secured on a substrate stage 42 of the lithography system 30. In some embodiments where the optical subsystem has a refractive mechanism, the POB 38 has refractive optics. The radiation light transmitted from the mask 36 is collected by the POB 38. In one embodiment, the POB 38 may include a magnification of less than one (thereby reducing the patterned image included in the radiation).

In some other embodiments where the optical subsystem has a reflective mechanism, the POB 38 has refractive optics. The radiation reflected from the mask 36 (e.g., a patterned radiation) is collected by the POB 38.

Back to the mask 36, the mask 36 includes two mask states different from each other in terms of transmissivity. Particularly, the two mask states have transmissivities t1 and t2, respectively, and optical phase (simply phase) φ1 and φ2, respectively.

In some embodiments, the two mask states have a phase difference about 180 degree in a certain range. Those two mask states are referred to as out of phase. Those descriptions are evaluated in the certain range, which is reasonably chosen, such as 15 degree. For example, when the phase difference is 180 degree in the certain range, such as 180±15 degree, the two mask states are considered as out of phase. Furthermore, in some embodiments, a first polygon is defined in the first mask state, and a second polygon adjacent the first polygon is defined in the second mask state. The background refers to the regions without main polygons (circuit features or dummy features). However, the background is defined in one of the two mask states, incorporated with sub-resolution features of another mask state. The sub-resolution features are non-printable features during the corresponding lithography patterning. In contrast, the main polygons are printable during the lithography patterning.

Figure 3:
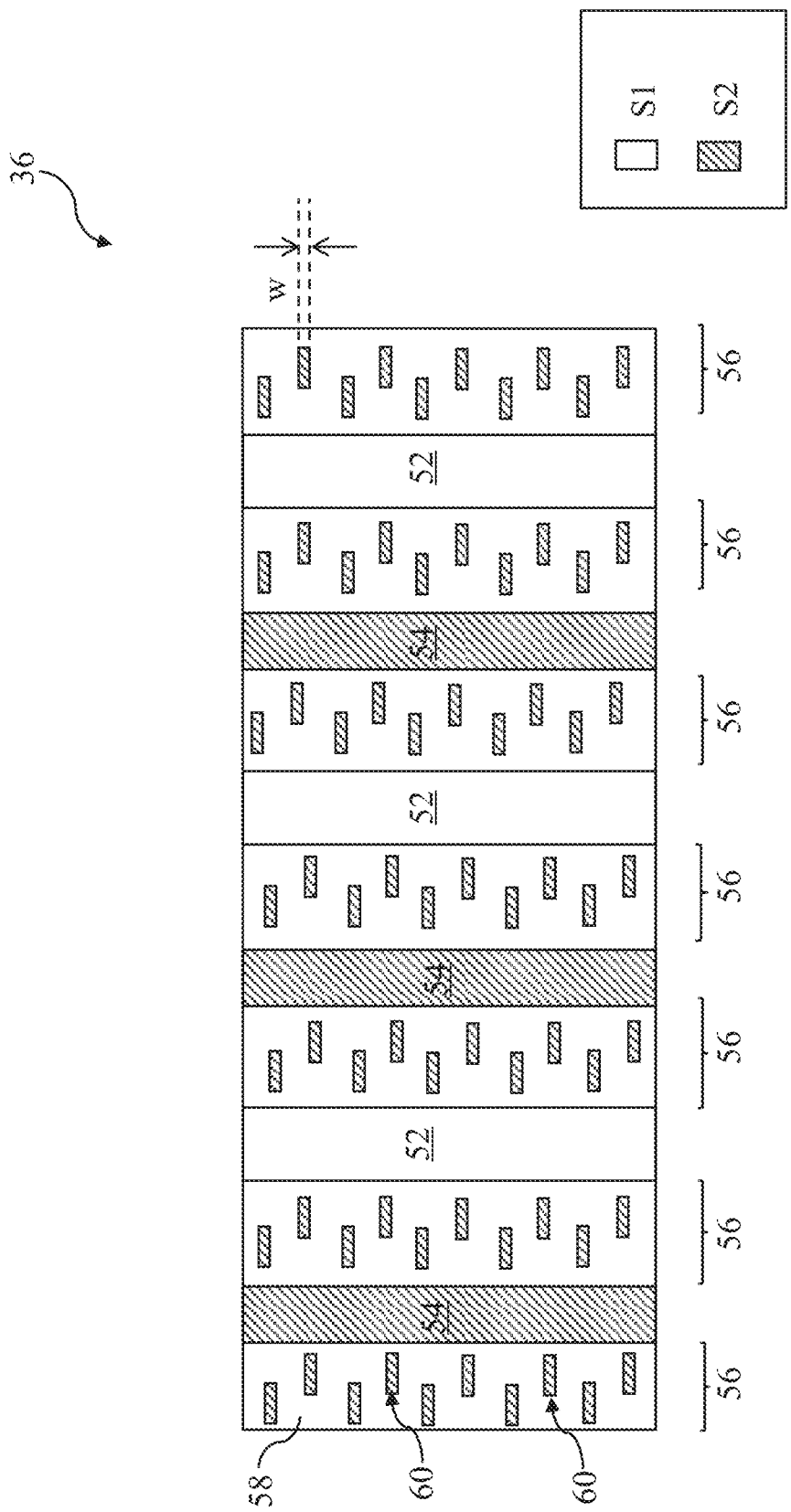
FIG. 3 is a top view of a mask constructed in accordance with some embodiments.

As illustrated in FIG. 3 as a top view of the mask 36, constructed in accordance with some embodiments. The mask 36 is designed to have two mask states S1 and S2 different from each other, in term of transmissivity. In some embodiments, the first mask state S1 and second mask state S2 are different from each other due to different transmissivities t1 and t2. In furtherance of the embodiments, the first mask state S1 and second mask state S2 are out of phase.

The mask 36 is patterned to define an IC layout pattern (or simply IC pattern). The IC pattern includes a plurality of main polygons, such as 52 and 54. The mask 36 is patterned to include two mask states, thereby defining the IC pattern on the mask 36. Especially, adjacent main polygons are assigned to respective mask states. For example, the main polygons 52 are assigned to the first mask state (defined in the first mask state) S1 and the main polygons 54 being adjacent to the main polygons 52 are assigned to the second mask state (defined in the second mask state) S2. The mask 36 also includes a background 56. The background includes regions without main polygon. The background 56 includes a field 58 and a plurality of sub-resolution assist polygons 60. The region without main polygon and sub-resolution assist polygon is referred to as the field. In the present embodiment, the field 58 is assigned to the first mask state S1, and the sub-resolution assist polygons 60 are assigned to the second state S2. In an alternative embodiment, the field 58 is assigned to the second mask state S2, and the sub-resolution assist polygons 60 are assigned to the first mask state S1.

The sub-resolution assist polygons 60 are polygons dimensioned to be unprintable on the target (such as semiconductor wafer) during a lithography process. Therefore the background 56 is imaged to the resist layer during the lithography process to a substantially uniform gray level with an average transmissivity t3, which is different from t1 and t2. The sub-resolution assist polygons 60 can be changed to have a certain pattern density in the background 56 such that the corresponding transmissivity t3 is tuned as desired. In some embodiments, the sub-resolution assist polygons 60 are designed to have a certain pattern density in the background 56 so that the corresponding transmissivity t3 is tuned to enhance the imaging contrast of the main polygons during the lithography process. Thus, the mask 36 has two mask states but achieve three types of regions different from each other in term of transmissivity (or average transmissivity), therefore referred to as three mask tones (three tones). Particularly, the three mask tones include the first mask state, second mask state and the background having the average transmissivity different from those of the first and second mask states. The mask 36 has two mask states but three mask tones. In some embodiments, by the same mechanism, the mask 36 may be designed to include two mask states and more than three mask tones. For example, in the background, the sub-resolution assist polygons 85 are modified to respective local pattern densities, therefore achieving more than three mask tones.

The sub-resolution assist polygons 60 may include rectangles, squares or other suitable geometries. For example, for a regular array of same rectangles with a width w (the dimension of the short edge of a rectangle, if w<λ/NA, then those assist polygons will not be printed on the target 40 during the lithography process.

The mask 36 with two mask states but three mask tones is designed to achieve the enhanced illumination resolution and the depth of focus (DOF) when used with the lithography system 30 and the method 10. The structure of the mask 36 and the method making the same will be further described below according to some embodiments.

The mask fabrication process includes two operations: a blank mask fabrication process and a mask patterning process. During the blank mask fabrication process, a blank mask is formed by depositing suitable layers (e.g., multiple reflective layers and an absorption layer) on a suitable substrate. The blank mask is patterned during the mask patterning process to have a design of a layer of an integrated circuit. The patterned mask is then used to transfer circuit patterns (the IC pattern) onto a semiconductor wafer. The patterns can be transferred over and over onto multiple wafers through various lithography processes. A set of masks (for example, a set of 15 to 30 masks) may be used to construct a complete IC.

Figure 4:
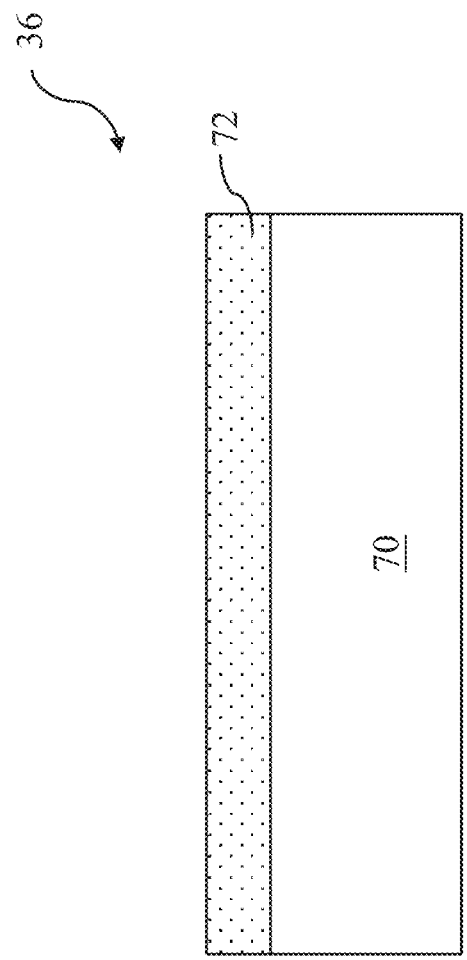
FIGS. 4-5 are cross-sectional views of a mask at various fabrication stages constructed in accordance with some embodiments.
Figure 5:
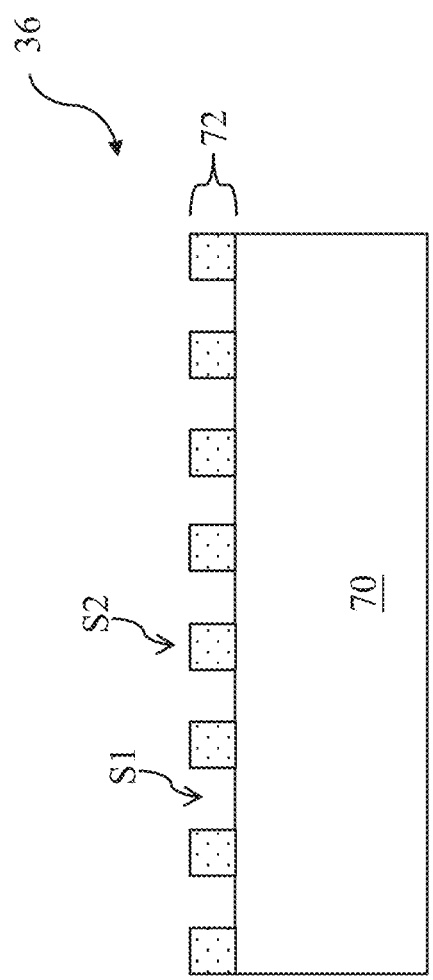

FIGS. 4-5 illustrate sectional views of the mask 36 at various fabrication stages, constructed according to some embodiments. The mask 36 shown in FIG. 4 is blank at a mask fabrication stage prior to the patterning. The mask 36 includes a mask substrate 70 made of a material being transparent to the radiation light of the radiation source 32. In some examples, the transparent substrate 70 includes fused quartz or other suitable material, such as borosilicate glass and soda-lime glass relatively free of defects.

The mask 36 further includes an absorption material layer 72 formed over the substrate 70. The absorption material layer 72 absorbs the radiation light from the radiation source 32 projected onto the mask 36. In some embodiments, the absorption material layer 72 is designed with its composition and thickness to substantially absorb the radiation light. In the present embodiment, the absorption material layer 72 includes chromium (Cr), or other suitable materials.

In some other embodiments, the absorption material layer includes chromium, chromium oxide, chrome nitride, chrome oxynitride, titanium, titanium oxide, titanium nitride, titanium oxynitride, tantalum, tantalum oxide, tantalum nitride, tantalum oxynitride, aluminum-copper, aluminum oxide, palladium, molybdenum, molybdenum silicon or combinations thereof.

The absorption material layer 72 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art. The MOD is a deposition technique by using a liquid-based method in a non-vacuum environment. By using MOD, a metal-organic precursor, dissolved in a solvent, is spin-coated onto a substrate and the solvent is evaporated. A vacuum ultraviolet (VUV) source is used to convert the metal-organic precursors to constituent metal elements.

Then, the absorption material layer 72 is patterned to define two mask states with three mask tones according to an IC pattern including sub-resolution polygons. Especially, three mask tones define respectively various features of the IC pattern on the mask 36. The patterning of the absorption material layer 72 may be implemented through a procedure that includes lithography process and etching. One embodiment of the patterning procedure is described below with reference to FIG. 5.

Referring to FIG. 5, an patterning operation is applied to the absorption material layer 72 to form the first mask state S1 and the second mask state S2 on the mask 36. The patterning operation includes a lithography process and an etching process. The lithography process may further include resist coating (e.g., spin-on coating), soft baking, mask aligning, exposure, post-exposure baking, developing the resist, rinsing, drying (e.g., hard baking), other suitable processes, and/or combinations thereof. In the present embodiment, the exposure employs electron-beam technology. Alternatively, the exposure process is implemented or replaced by other proper methods such as maskless photolithography, or ion-beam writing. The lithography process forms a patterned resist layer with openings defined the regions for the first mask state S1.

The etching process is followed to remove portions of the absorption material layer 72, thereby forming the first mask state S1 and second mask state S1. The etching process may include dry (plasma) etching, wet etching, and/or other etching methods. In some embodiments, a plasma etching process is applied to selectively remove the absorption material layer 72 by chlorine-based gas. The patterned resist layer is used as an etch mask during the etching process, therefore only portions of the absorption material layer 72 within the openings of the patterned resist layer are removed.

Thus, the absorption material layer 72 is patterned to form the IC pattern, as illustrated in FIG. 3. Especially, the mask 36 is patterned to include two mask states and three mask tones, such that the adjacent main polygons are defined in the first mask state S1 and second mask state S2, respectively. The background 56 is patterned to include the field 58 and the sub-resolution assist polygons 60. The background 58 is defined in the third mask tone different from those of the first and second mask states.

Still referring to FIG. 3, the mask 36 includes two mask states S1 and S2 with respective transmissivities t1 and t2. In some embodiment, the absolute value of t1 is greater than the absolute value of t2. In the present embodiment, t1 is substantially close to 1 and t2 is substantially close to 0. The sub-resolution assist polygons 60 are not printable, achieving the background with a quasi-uniform transmissivity t3, of which the absolute value is between those of t1 and t2.

Referring back to FIG. 1, the operation 12 in the method 10 may further include other steps, such as alignment after the mask 36 is secured on the mask stage.

Still referring to FIG. 1, the method 10 also includes an operation 14 to load a target 40 to the substrate stage 42 of the lithography system 30. In the present embodiment, the target 40 is a semiconductor substrate, such as a silicon wafer. The target 40 is coated with a resist layer that is sensitive to the radiation light. The resist layer is to be patterned by a lithography exposure process such that the IC pattern of the mask 36 is transferred to the resist layer.

Figure 6:
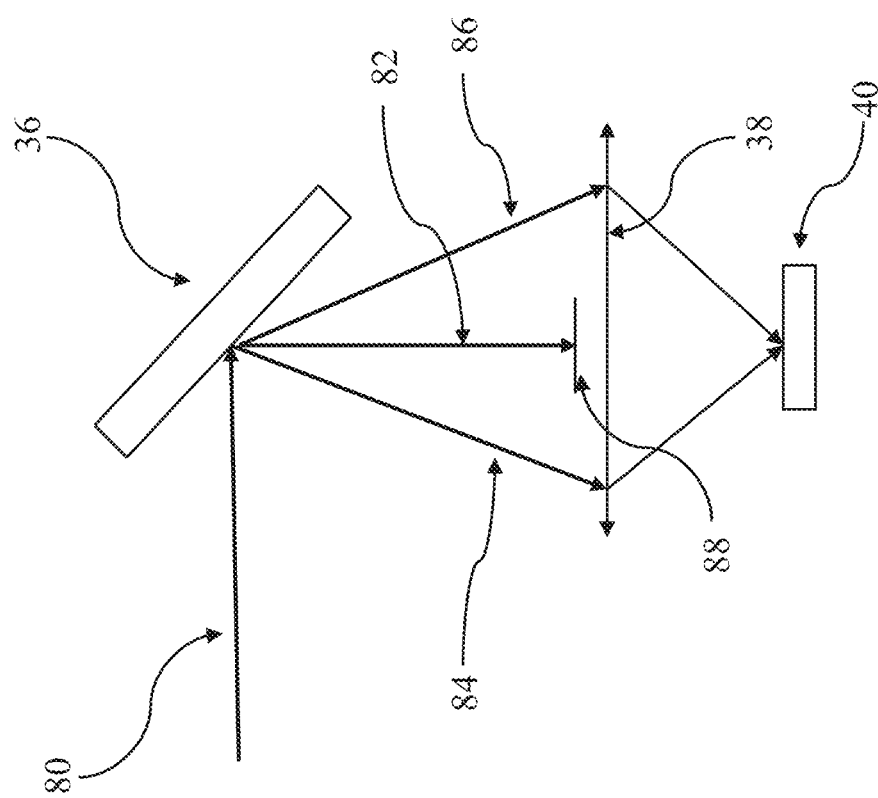
FIG. 6 is a diagrammatic perspective view of the lithography system of FIG. 2, in portion, constructed in accordance with some embodiments.

Referring to FIG. 1, the method 10 includes an operation 16 by setting the illuminator 34 of the lithography system 30 in a nearly on-axis illumination mode (ONI). The illumination mode is configured with a partial coherence σ less than about 0.1 to produce diffracted light and non-diffracted light. Referring to FIG. 6, an incident light ray 80, after being reflected from the mask 36, is diffracted into various diffraction orders due to presence of these mask patterns, such as a 0-th diffraction order ray 82, a −1-st diffraction order ray 84 and a +1-st diffraction order ray 86. In the depicted embodiment, the non-diffracted light rays 82 are mostly removed by the pupil filter 88. The −1-st and +1-st diffraction order rays, 84 and 86, are collected by the POB 38 and directed to expose the target 40.

Figure 7:
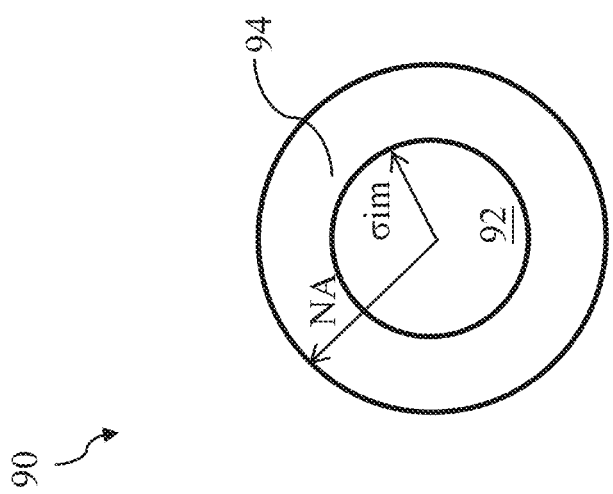
FIG. 7 illustrates a schematic view of an illumination pattern implemented by the method of FIG. 1, constructed in accordance with some embodiments.

The on-axis illumination mode may be achieved by a mechanism, like an aperture with a certain illumination pattern, such as a disk illumination pattern 90 illustrated in FIG. 7, constructed in accordance with some embodiments. The illumination pattern 90 includes an illuminated portion 92 and a blocked portion 94. The aperture is configured at an illumination pupil plane to achieve the on-axis illumination mode. However, the aperture causes the radiation loss.

In some embodiments, the illuminator 34 includes various switchable lenses or other optical components with other suitable mechanism to tune the transmissivities of the radiation light from those lenses or other suitable optical components. In furtherance of the present embodiment, the on-axis illumination mode is achieved by configuring the switchable lenses in the illumination stage to achieve the on-axis illumination. The illumination pattern 90 is further defined by a parameter $\sigma_{im}$, which is the radius of the illuminated portion 92, evaluated relative to NA that is the numerical aperture. In some embodiments, the parameter $\sigma_{im}$ is chosen to be less than about 0.3. In some embodiments, the illumination pattern 90 may be determined according to the IC pattern.

Referring to FIG. 1, the method 10 may include an operation 18 by configuring a pupil filter in the lithography system 30. The pupil filter is configured in a projection pupil plane of the lithography system 30. The pupil filter is placed in the projection pupil plane to filter out specific spatial frequency components of the radiation light from the mask 36.

Figure 8:
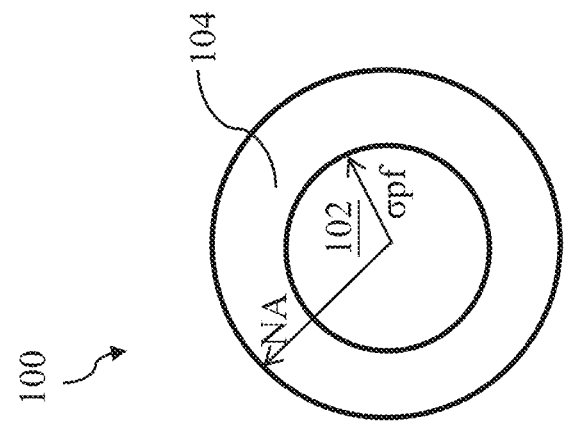
FIG. 8 illustrates a schematic view of a filtering pattern implemented by the method of FIG. 1, constructed in accordance with some embodiments.
Figure 12A:
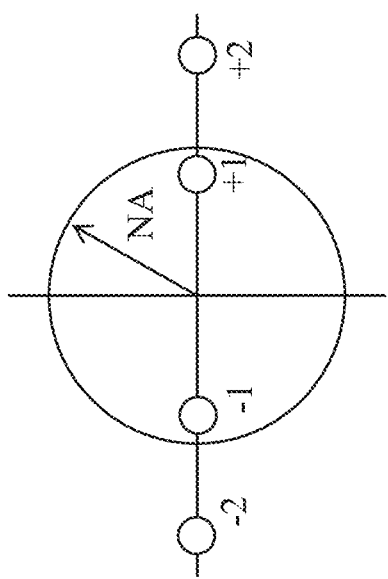
FIGS. 12A and 12B illustrate diagrammatic views of a numerical aperture and diffracted light from the mask constructed in accordance with some embodiments.
Figure 12B:
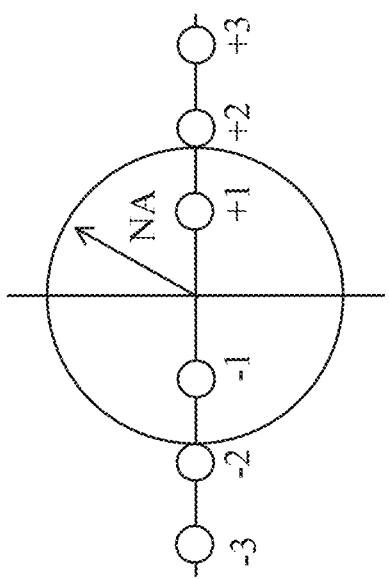

The pattern defined in the pupil filter is determined by the illumination mode. The pattern of the pupil filter is designed to remove at least a portion of the non-diffracted light from the mask 36, such as at least about 70%, in intensity, of the non-diffracted light, which is the 0-th order diffraction light from the mask 36. In some embodiments, the pattern in the pupil filter is substantially complimentary to the pattern of the illumination mode. For example, when the illumination pattern 90 is defined as a disk pattern in FIG. 12, the corresponding pattern of the pupil filter is a similar but reversed pattern 100 (filtering pattern 100) as illustrated in FIG. 8. The filtering pattern 100 includes a blocking portion 102 (a similar disk) and a collecting portion 104. The radiation light reaching the blocking portion 102 in the pupil plane will be blocked. The radiation light reaching the collecting portion 104 in the pupil plane will be collected by POB 38 and be directed to the target 40. The filtering pattern 100 is further defined by a parameter $\sigma_{pf}$, which is the radius of the blocking portion 102. Here $\sigma_{pf}$ is evaluated relative to NA. In some examples, the illumination pattern 90 has a disk illumination with a partial coherence $\sigma_{im}$ less than about 0.3. The filtering pattern 100 is determined according to the illumination pattern 90 so that most of the non-diffracted light is removed by the pupil filter 100, such as more than 70% of the non-diffracted light is removed, thereby utilizing mainly the diffracted light from two symmetrically located (on the pupil plane) and intensity balanced −1-st and +1-st diffraction orders to expose a semiconductor wafer. In some embodiments noted above, the illumination pattern 90 is complimentary to the filtering pattern 100, formulated as $\sigma_{pf} = \sigma_{im}$. In some embodiments, the filtering pattern may be slightly different from the illumination pattern, formulated as $\sigma_{pf} > \sigma_{im}$. Collectively, the filtering pattern is determined by the illumination pattern, formulated as $\sigma_{pf} \geq \sigma_{im}$. In one example where $\sigma_{im}$ is less than 0.3, $\sigma_{pf}$ is greater than 0.3.

Referring back to FIG. 1, the method 10 proceeds to operation 20 by performing a lithography exposure process to the target 40 in the configured illumination mode and the pupil filter. The radiation light from the radiation source 32 is modulated by the illuminator 34 with the radiation energy distribution for the on-axis illumination, directed from the mask 36, and further filtered by the pupil filter, the radiation light images the IC pattern of the mask 36 to the target 40 with enhanced energy latitude (EL) and DOF.

Still referring back FIG. 1, the method 10 may further include other operations. For example, the method 10 includes an operation 22 by developing the exposed resist layer coated on the target 40, thereby forming a patterned resist layer with one or more openings imaged from the IC pattern defined on the mask 36.

In another example, the method 10 further includes an operation 24 by performing a fabrication process to the target 40 through the patterned resist layer. In one embodiment, the substrate or a material layer of the target is etched through the openings of the patterned resist layer, thereby transferring the IC pattern to the substrate or the underlying material layer. In furtherance of the embodiment, the underlying material layer is an interlayer dielectric (ILD) layer disposed on the semiconductor substrate. The etching process will form contacts or vias in the corresponding ILD layer. In another embodiment, an ion implantation process is applied to the semiconductor substrate through the openings of the patterned resist layer, thereby forming doped features in the semiconductor substrate according to the IC pattern. In this case, the patterned resists layer functions as an ion implantation mask.

Various embodiments of the method 10 and the mask 36 are described according to the present disclosure. Other alternatives and modifications may present without departure from the spirit of the present disclosure. In one embodiment, the IC pattern defined on the mask 36 may further include various dummy polygons. In one example, the dummy polygons are assigned similarly with the circuit polygons of the IC pattern such that adjacent main polygons (circuit polygons and dummy polygons) are assigned to different mask states. In various examples, the resist material coated on the target to receive the lithography exposure process may be a positive tone resist or negative tone resist.

Figure 9A:
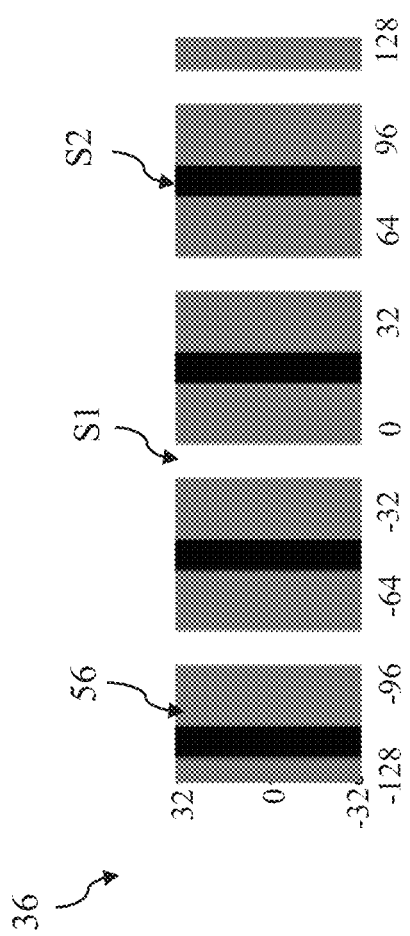
FIG. 9A is a top view of a mask constructed in accordance with some embodiments.
Figure 9B:
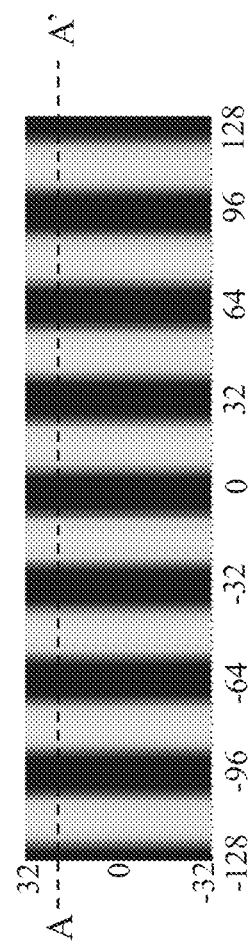
FIG. 9B is a diagrammatic view of the exposure energy distribution in gray scale associated with the mask of FIG. 9A.
Figure 9C:
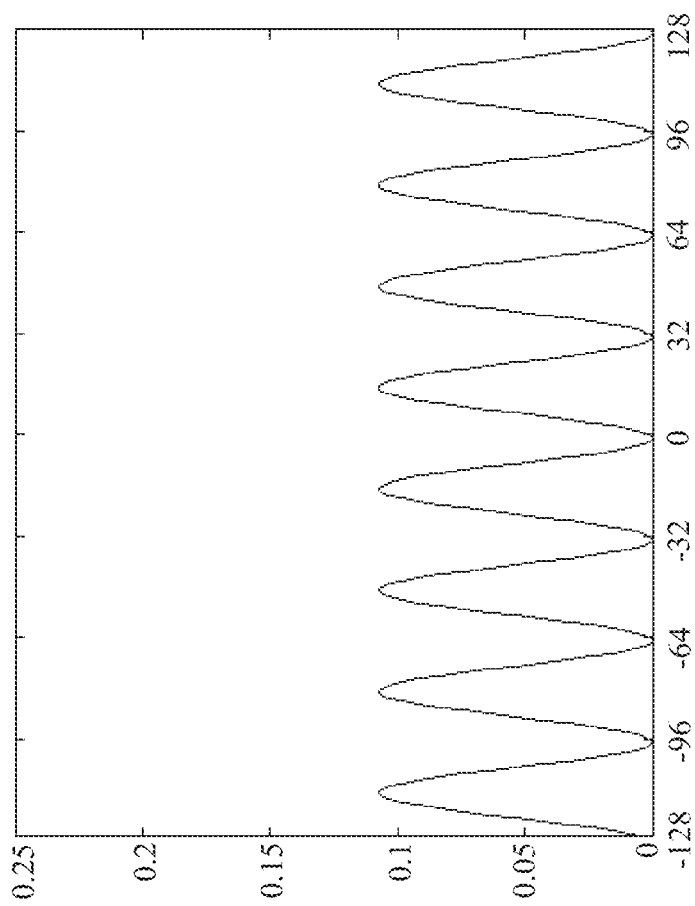
FIG. 9C is a diagrammatic view of the exposure energy distribution in diagram associated with the mask of FIG. 9A.

Furthermore, the mask 36 and the method 10 may be used to form various IC pattern with enhanced imaging effect. First example is illustrated in FIGS. 9A through 9C. FIG. 9A illustrates a top view of the mask 36 in accordance with some embodiments. The first mask state S1, the second state S2 and the background 56 having a third mask tone (such as the third transmissivity t3) are labeled respectively. FIG. 9B illustrates the corresponding exposure energy distribution on the resist layer in gray scale. FIG. 9C illustrates the corresponding exposure energy distribution along the line AA' on the resist layer in diagram where the horizontal axis represents the distance along the line AA' and the vertical axis represents the exposure energy. The IC pattern defined on the mask 36 includes a plurality of line features. Lines and spacing between the lines are clearly imaged by the method 10.

Figure 10C:
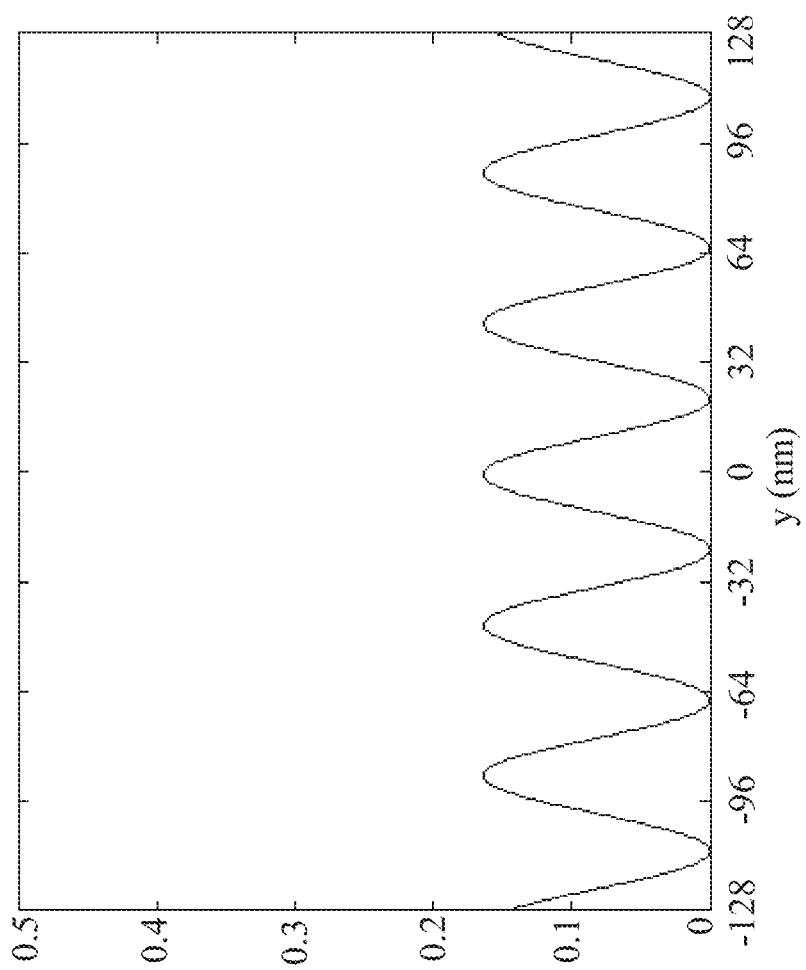
FIG. 10C is a diagrammatic view of the exposure energy distribution in diagram associated with the mask of FIG. 10A.

Second example is illustrated in FIGS. 10A through 10C. FIG. 10A illustrates a top view of the mask 36 in accordance with some embodiments. The first mask state S1, the second state S2 and the background 56 having the third mask tone are labeled respectively. FIG. 10B illustrates the corresponding exposure energy distribution on the resist layer in gray scale. FIG. 10C illustrates the corresponding exposure energy distribution along the line AA' on the resist layer in diagram where the horizontal axis represents the distance along the line AA' and the vertical axis represents the exposure energy. The IC pattern defined on the mask 36 includes a plurality of hole features (such as contact holes) in array. Hole features are clearly imaged by the method 10 with enhanced contrast.

Figure 11D:
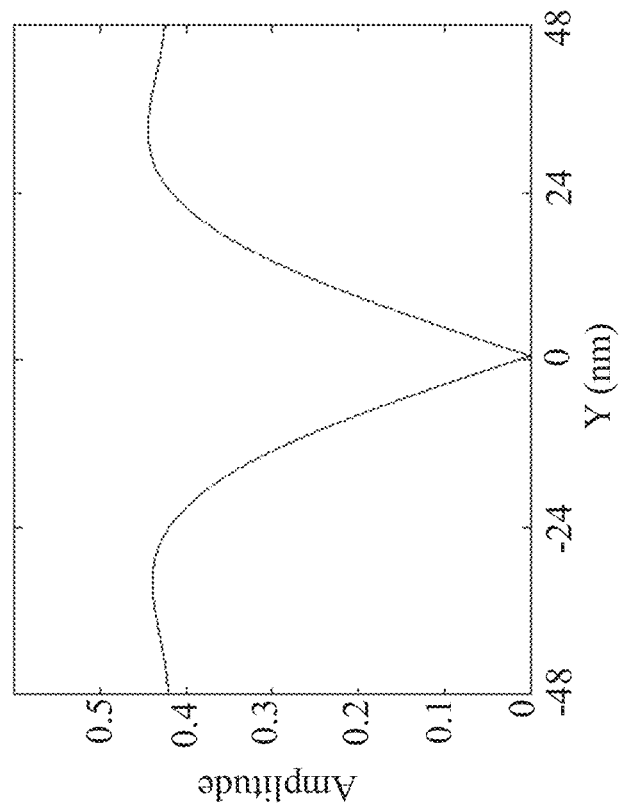
FIG. 11D is a diagrammatic view of the exposure energy distribution in diagram along Y direction associated with the mask of FIG. 11A.
Figure 11C:
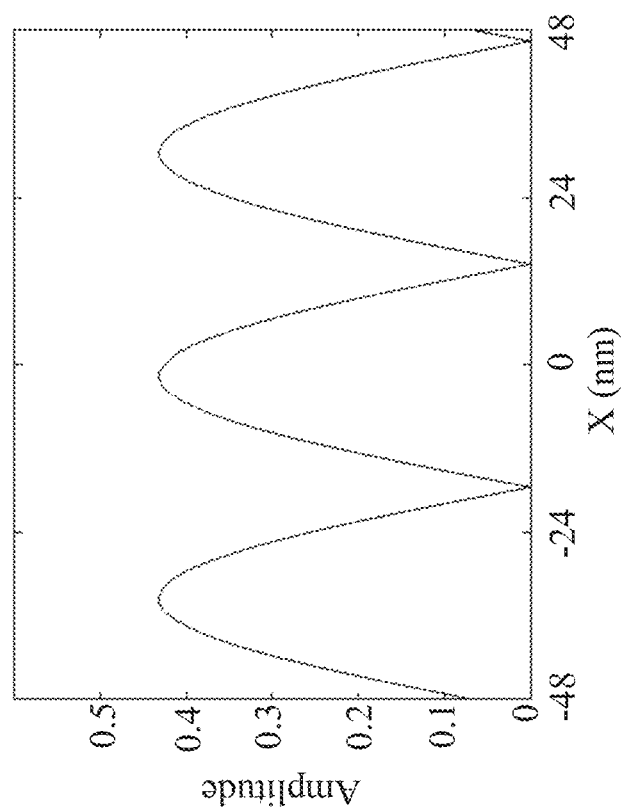
FIG. 11C is a diagrammatic view of the exposure energy distribution in diagram along X direction associated with the mask of FIG. 11A.

Third example is illustrated in FIGS. 11A through 11D. FIG. 11A illustrates a top view of the mask 36 in accordance with some embodiments. The first mask state S1, the second mask state S2 and the background 56 having the third mask tone are labeled respectively. FIG. 11B illustrates the corresponding exposure energy distribution on the resist layer in gray scale. FIG. 11C illustrates the corresponding exposure energy distribution along the line AA' on the resist layer in diagram and FIG. 11D illustrates the corresponding exposure energy distribution along the line BB' on the resist layer in diagram. The IC pattern defined on the mask 36 includes a plurality of lines. The line/spacing in the X direction and the line end to end in the Y direction both achieve the highest contrast simultaneously.

In another embodiment, a lithography process includes forming a mask with two mask states and three mask tones, assigning different states of the mask to adjacent polygons and the background, exposing the mask by nearly an on-axis illumination (ONI) with partial coherence σ less than 0.3 to produce diffracted light and non-diffracted light, removing more than 70% of the non-diffracted light, and collecting and directing the diffracted light and the not removed non-diffracted light by a projection optics box (POB) to expose the target 40.

Figure 13:
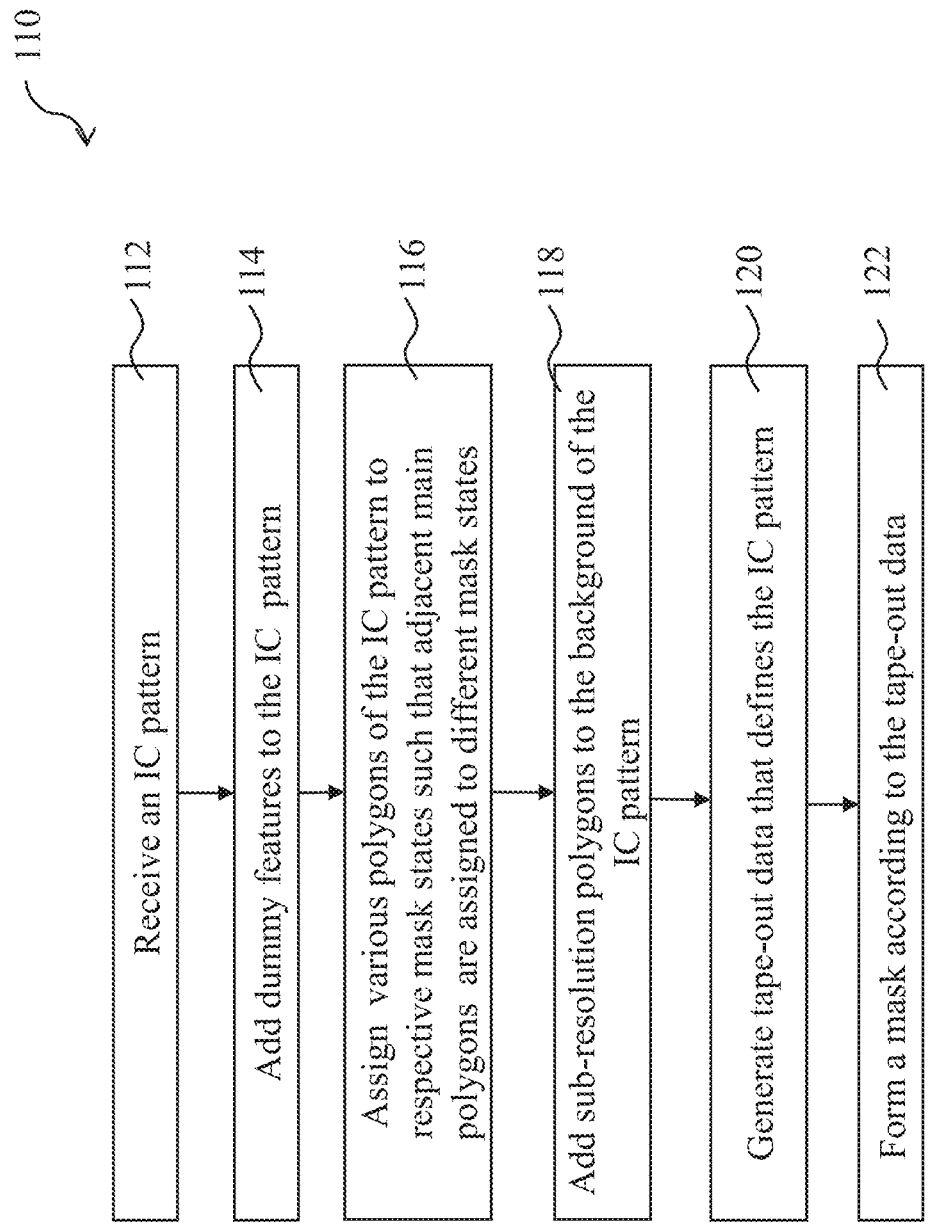
FIG. 13 is a flowchart of a method for mask making constructed in accordance with some embodiments.

FIG. 13 illustrates a flowchart of a method 110 for generating a mask, constructed in accordance with some embodiments. The method 110 begins at 112 by receiving an IC pattern. The IC pattern includes a circuit layout with a plurality of circuit polygons to be transferred to the target.

The method 110 may include an operation 114 by adding additional features, such as dummy polygons, to the IC pattern. The dummy polygons are added to the IC pattern for one or more fabrication functions, such as CMP dummy polygons for chemical mechanical polishing (CMP) uniformity or thermal dummy polygons for thermal annealing uniformity. The circuit polygons and the dummy polygons are collectively referred to as main polygons.

The method 110 includes an operation 116 by assigning various polygons to respective mask states. Particularly, adjacent main polygons are assigned to different mask states. For example, a first main polygon is assigned to the first mask state S1 and a second main polygon adjacent the first main polygon is assigned to the second mask state S2.

The method 110 further includes an operation 118 by adding sub-resolution polygons to the background of the IC pattern. The sub-resolution assist polygons may be designed as long rectangles, squares, other suitable geometries or a combination thereof. Particularly, the sub-resolution polygons are assigned to a same mask state and the field is assigned to another mask state different from the mask state assigned to the sub-resolution polygons.

In some embodiments, the field is assigned to the first mask state S1, and the sub-resolution assist polygons are assigned to the second state S2. In some other embodiments, the field is assigned to the second mask state S2, and the sub-resolution assist polygons are assigned to the first mask state S1. Therefore the background is imaged to the resist layer during the lithography process to a substantially uniform gray level with an average transmissivity t3 different from t1 and t2. The sub-resolution assist polygons are designed to have a certain pattern density in the background such that the corresponding transmissivity t3 is tuned to enhance the imaging contrast of the main polygons during the lithography process. Thus, the mask has two mask states but achieve three mask tones different from each other in term of transmissivity. In some embodiments, by the same mechanism, the IC pattern may be designed to include two mask states and more than three mask tones. For example, in the background, the sub-resolution assist polygons are modified to respective local pattern densities, therefore achieving more than three mask tones.

The method 110 may further include an operation 120 by generating tape-out data that defines the IC pattern. The IC pattern includes main polygons assigned to respective mask states, the sub-resolution polygons assigned to one mask state and the field assigned to another mask state.

The method 110 may further include an operation 122 by forming a mask according to the tape-out data. In some embodiment, the formation of the mask includes deposition, electron-beam lithography process and etching as described above associated with FIGS. 3-5.

The present disclosure provides a mask structure, a lithography process and a method to generate the mask in accordance with various embodiments. The mask defines an IC pattern with a plurality of main polygons and includes two mask states but three mask tones. Adjacent main polygons are assigned to different mask states. The background of the IC pattern includes a plurality of sub-resolution polygons assigned to a same mask state and a field assigned to another mask state. The lithography process uses the mask and on-axis illumination. The lithography process employs an illumination pattern and a pupil filter designed according to the illumination pattern. The method to generate the mask includes assigning various main polygons to respective mask states such that adjacent main polygons are assigned to different mask states; and adding sub-resolution polygons to the background.

The embodiments of the present disclosure offer advantages over existing art, though it is understood that other embodiments may offer different advantages, not all advantages are necessarily discussed herein, and that no particular advantage is required for all embodiments. The method 10 can achieve the same minimum pitch as that by off-axis illumination (OAI) under the given NA. When OAI is used, since the location of the 0th diffraction order on the pupil plane is fixed, the DOF starts to degrade once the pitch is deviated from the optimized pitch. The DOF is almost minimum for $P>1.5\times P_{min}$. Since in the pitch range of $1.5\times P_{min}\sim 2\times P_{min}$, implementing assist feature (AF) is not helpful in increasing the DOF. There is the forbidden-pitch problem. By using the method 10, the DOF remains maximized until the 2nd diffraction orders come in. That is, the DOF is maximized in the pitch range of $1\times P_{min}\sim 2\times P_{min}$, as illustrated FIGS. 12A and 12B. There is no forbidden-pitch problem.

The +1-st and −1-st diffraction orders are balanced in strength, the energy latitude is maximized. Furthermore, on the pupil plane, since +1-st and −1-st diffraction orders are of the same distance (such as illustrated in FIG. 6) from the pupil center, DOF is also maximized simultaneously.

The present disclosure provides a lithography process in a lithography system in accordance with some embodiments. The lithography process includes loading a mask that includes two mask states defining an integrated circuit (IC) pattern. The IC pattern includes a plurality of main polygons, wherein adjacent main polygons are assigned to different mask states; and a background includes a field in one of the mask states and a plurality of sub-resolution polygons in another of the two mask states. The lithography process further includes configuring an illuminator of the lithography system pattern in an on-axis illumination mode; configuring a pupil filter in a pupil plane of the lithography system with a filtering pattern determined according to the illumination pattern; and performing an exposure process to a target with the mask, the configured illuminator and the configured pupil filter.

The present disclosure also provides a mask in accordance with some embodiments. The mask includes a substrate; and an absorption material layer formed over the substrate. The absorption material layer is patterned to include two mask states that define an integrated circuit (IC) pattern having a plurality of main polygons and a background. Adjacent main polygons are assigned to different mask states. The background includes a field in one of the two mask states and a plurality of sub-resolution polygons in the other of the two mask states.

The present disclosure also provides a method for generating a mask in accordance with some embodiments. The method includes receiving an integrated circuit (IC) pattern having a plurality of main polygons and a background; assigning various main polygons to respective mask states such that adjacent main polygons are assigned to different mask states; and adding sub-resolution polygons to the background.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography process in a lithography system, comprising:
   loading a mask that includes two mask states defining an integrated circuit (IC) pattern, wherein the IC pattern includes:
      a plurality of main polygons, wherein adjacent main polygons are assigned to two different mask tones, each mask tone being formed using a different one of the two mask states; and
      a background is assigned to a third mask tone formed using a combination of the two mask states, the combination including a field in one of the mask states and a plurality of sub-resolution polygons in another of the two mask states;
   configuring an illuminator to generate an illuminating pattern on an illumination pupil plane of the lithography system;
   configuring a pupil filter on a projection pupil plane of the lithography system with a filtering pattern determined according to the illumination pattern; and
   performing an exposure process to a target with the illuminator, the mask, and the pupil filter, wherein the exposure process produces diffracted light and non-diffracted light behind the mask and the pupil filter removes most of the non-diffracted light.

2. The lithography process of claim 1, wherein the illumination pattern corresponds to an on-axis illumination.

3. The lithography process of claim 1, wherein the illumination pattern corresponds to a partially coherent illumination.

4. The lithography process of claim 1, wherein the illumination pattern has an illuminated portion $\sigma_{im}$, wherein $\sigma_{im}$ is less than 0.3.

5. The lithography process of claim 1, wherein the filtering pattern is substantially complimentary to the illumination pattern.

6. The lithography process of claim 1, wherein
   the illumination pattern has an illuminated portion $\sigma_{im}$; and
   the filtering pattern has a blocking portion $\sigma_{pf}$, wherein
   $\sigma_{pf} \geq \sigma_{im}$.

7. The lithography process of claim 1, wherein the first polygon, the second polygon and the background have respective transmissivities different from each other.

8. The lithography process of claim 7, wherein
the first mask state and the second mask state have transmissivities t1 and t2;
the background has an average transmissivity t3; and
t1 is greater than t3 and t2 is less than t3.

9. The lithography process of claim 1, wherein the mask includes
a transparent substrate; and
an absorption material layer formed over the transparent substrate, wherein the absorption material layer is patterned to define the first and second mask states being different from each other.

10. The lithography process of claim 9, wherein the absorption material layer includes chromium.

11. A mask, comprising:
a substrate; and
an absorption material layer formed over the substrate, wherein
the absorption material layer is patterned to include two mask states that define an integrated circuit (IC) pattern having a plurality of main polygons and a background,
adjacent main polygons are assigned to two different mask tones, each mask tone being formed using a different one of the two mask states, and
the background is assigned to a third mask tone formed using a combination of the two mask states, the combination including a field in one of the two mask states and a plurality of sub-resolution polygons in the other of the two mask states.

12. The mask of claim 11, wherein the sub-resolution polygons include a pattern density tuned such that an imaging contrast of the main polygons is enhanced during a lithography process.

13. The mask of claim 11, wherein the sub-resolution polygons are designed to have a shape selected from the group consisting of rectangles, squares, and combinations thereof.

14. The mask of claim 11, wherein the substrate includes a transparent material.

15. The mask of claim 14, wherein
the substrate includes fused quartz; and
the absorption material layer includes chromium.

16. The mask of claim 14, wherein the absorption material layer includes a material selected from the group consisting of chromium, chromium oxide, chrome nitride, chrome oxynitride, titanium, titanium oxide, titanium nitride, titanium oxynitride, tantalum, tantalum oxide, tantalum nitride, tantalum oxynitride, aluminum-copper, aluminum oxide, palladium, molybdenum, molybdenum silicon and a combination thereof.

17. A method for generating a mask, comprising:
receiving an integrated circuit (IC) pattern having a plurality of main polygons and a background;
assigning various main polygons to one of two mask states such that adjacent main polygons are assigned to two different mask tones, each mask tone being formed using a different one of the two mask states; and
adding sub-resolution polygons to the background, thereby forming a third mask tone formed using a combination of the two mask states.

18. The method of claim 17, wherein the sub-resolution polygons are assigned to a same mask state and the rest of the background is assigned to another mask state different from the mask state assigned to the sub-resolution polygons.

19. The method of claim 17, wherein the adding of the sub-resolution polygons includes adding the sub-resolution features with a pattern density in the background such that an average transmissivity in the background is tuned to enhance an imaging contrast of the main polygons during a lithography process with the mask.

20. The method of claim 17, wherein the sub-resolution polygons are designed to have at least one of rectangles, squares, and a combination thereof.

21. The method of claim 17, further comprising forming the mask according to the IC pattern, wherein the forming of the mask includes
forming an absorption material layer over a transparent substrate; and
patterning the absorption material layer to define a first mask state in first regions free of the absorption layer and a second mask state in second regions that include both the absorption material layer and the transparent substrate.

* * * * *